United States Patent
Watai

(10) Patent No.: US 11,932,287 B2
(45) Date of Patent: Mar. 19, 2024

(54) CONTROL DEVICE FOR RAILWAY VEHICLE

(71) Applicant: Mitsubishi Electric Corporation, Tokyo (JP)

(72) Inventor: Atsuki Watai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 849 days.

(21) Appl. No.: 16/981,353

(22) PCT Filed: Mar. 23, 2018

(86) PCT No.: PCT/JP2018/011717
§ 371 (c)(1),
(2) Date: Sep. 16, 2020

(87) PCT Pub. No.: WO2019/180918
PCT Pub. Date: Sep. 26, 2019

(65) Prior Publication Data
US 2021/0086801 A1    Mar. 25, 2021

(51) Int. Cl.
*B61C 17/12* (2006.01)
*B61C 17/00* (2006.01)
(Continued)

(52) U.S. Cl.
CPC .............. *B61C 17/12* (2013.01); *B61C 17/00* (2013.01); *H05K 5/0221* (2013.01); *H05K 5/0226* (2013.01); *H05K 5/03* (2013.01)

(58) Field of Classification Search
CPC .......... B61C 17/00; B61C 17/12; H05K 5/02; H05K 5/03; H05K 5/04; H05K 5/0217; H05K 5/0221; H05K 5/0226
See application file for complete search history.

(56) References Cited

U.S. PATENT DOCUMENTS 3,685,093 A * 8/1972 Sanders ................ E05D 15/505
                                                        16/231

FOREIGN PATENT DOCUMENTS

JP        06225432 A  *  8/1994
JP     H06225432 A       8/1994
(Continued)

OTHER PUBLICATIONS

International Search Report (PCT/ISA/210), with translation, and Written Opinion (PCT/ISA/237) dated Jun. 26, 2018, by the Japan Patent Office as the International Searching Authority for International Application No. PCT/JP2018/011717.
(Continued)

*Primary Examiner* — S. Joseph Morano
*Assistant Examiner* — Cheng Lin
(74) *Attorney, Agent, or Firm* — BUCHANAN INGERSOLL & ROONEY PC

(57) ABSTRACT

A control device for a railway vehicle includes a housing and a cover covering an opening. The housing is provided with a pair of first members. The cover is provided with a second member having a plate shape. The contact of an edge of a hole portion of the second member with the vertically lower bottoms of edges of notch portions of the pair of first members causes the second member to be supported by the first members so as to be rotatable about a rotational axis. The contact of edges of the hole portion with the pair of first members restricts displacement of the second member.

19 Claims, 18 Drawing Sheets

(51) Int. Cl.
  *H05K 5/02*  (2006.01)
  *H05K 5/03*  (2006.01)

(56) References Cited

FOREIGN PATENT DOCUMENTS

| | | | |
|---|---|---|---|
| JP | H08121431 A | | 5/1996 |
| JP | H10266677 A | * | 10/1998 |
| JP | H10266677 A | | 10/1998 |
| JP | 2016127102 A | * | 7/2016 |
| JP | 2016127102 A | | 7/2016 |
| KR | 20170032784 A | * | 3/2017 |
| WO | WO-0190594 A1 | * | 11/2001 .............. B41J 29/13 |

OTHER PUBLICATIONS

Office Action dated Aug. 24, 2021, in corresponding India Patent Application No. 202027040026, with English translation. (5 pages).

\* cited by examiner

CONTROL DEVICE FOR RAILWAY VEHICLE

TECHNICAL FIELD

The present disclosure relates to a control device for a railway vehicle.

BACKGROUND ART

Control devices for railway vehicles include housings having waterproofness and dust resistance. Each of the housings accommodates a control unit for controlling a railway vehicle. The control unit includes a power converter, a circuit breaker, a transformer, a reactor, and other components. The housing is provided with an opening that allows for inspection and maintenance of the control unit inside the housing. The housing is also provided with a cover that covers the opening. An example of such a housing is the case with a cover disclosed in Patent Literature 1. The case with a cover disclosed in Patent Literature 1 includes a case body and the cover. The cover includes arms having tips bent toward the center of the cover on the rear surface of the cover. The arms each have a notch extending in the vertical direction. The case body includes engaging portions that are opposed to the respective arms and have insertion holes in which the respective arms are insertable. The notches formed on the arms of the cover engage with the respective engaging portions of the case body, so as to install the cover to the case body. The rotational axis for opening and closing the cover extends in the vertical direction.

CITATION LIST

Patent Literature

Patent Literature 1: Unexamined Japanese Patent Application Publication No. H10-266677

SUMMARY OF INVENTION

Technical Problem

In the case with a cover disclosed in Patent Literature 1, the installation of the cover to the case body is achieved by first sliding the cover in the direction of extension of the notches, and then sliding the cover in the opposite direction to engage the notches with the engaging portions. Since both the notches and the rotational axis for opening and closing the cover extend in the vertical direction, as described above, the cover may be unintentionally detached from the case body in response to application of a force in a direction parallel to the rotational axis during opening or closing of the cover. If the case includes hinges having a shape for preventing detachment of the cover from the case body, the structure of the device would be complicated.

An objective of the present disclosure, which has been accomplished in view of the above situations, is to simplify the structure of a control device for a railway vehicle while preventing detachment of a cover.

Solution to Problem

In order to achieve the above objective, a control device for a railway vehicle according to an aspect of the present disclosure includes a housing, a cover, a pair of first members, and a second member. The housing is provided with an opening. The cover covers the opening. The pair of first members is attached to the housing. The second member having a plate shape is detachably attached to the pair of first members. Each of the pair of first members has a notch portion. The pair of first members includes a first metal plate having bent end portions and a central portion disposed between the end portions. The central portion of the first metal plate is attached to the housing so as to attach the pair of first members to the housing. The second member has a hole portion including a through hole penetrating both of main surfaces of the second member or including a pair of notches extending from respective side surfaces of the second member in mutually approaching directions. The contact of an edge of the hole portion with the vertically lower bottoms of the notch portions causes the second member to be supported by the pair of first members so as to be rotatable about a rotational axis. The contact of edges of the hole portion with the pair of first members restricts displacement of the second member. The second member is attached to the cover and rotates integrally with the cover, thereby opening or closing the opening.

Advantageous Effects of Invention

According to the present disclosure, the second member is supported by the pair of first members attached to the housing so as to be rotatable about the rotational axis, and the pair of first members are in contact with the second member. This configuration can simplify the structure of a control device for a railway vehicle while preventing detachment of a cover.

DESCRIPTION OF EMBODIMENTS

Control devices for a railway vehicle according to embodiments of the present disclosure are described below in detail with reference to the drawings. Components that are the same or equivalent are assigned the same reference signs throughout the drawings.

Embodiment 1

Figure 1:
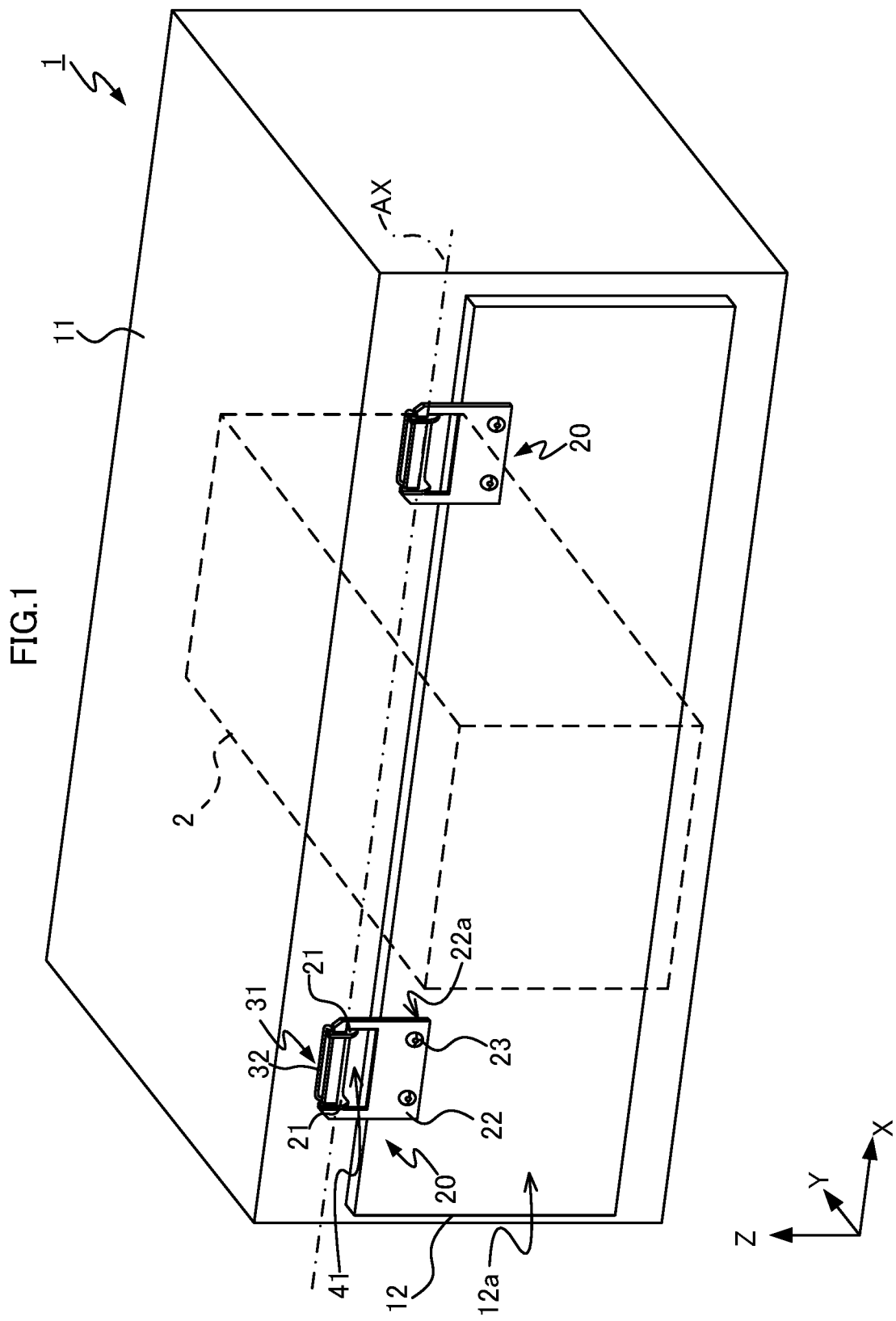
FIG. 1 is a perspective view of a control device for a railway vehicle according to Embodiment 1 of the present disclosure.
Figure 2:
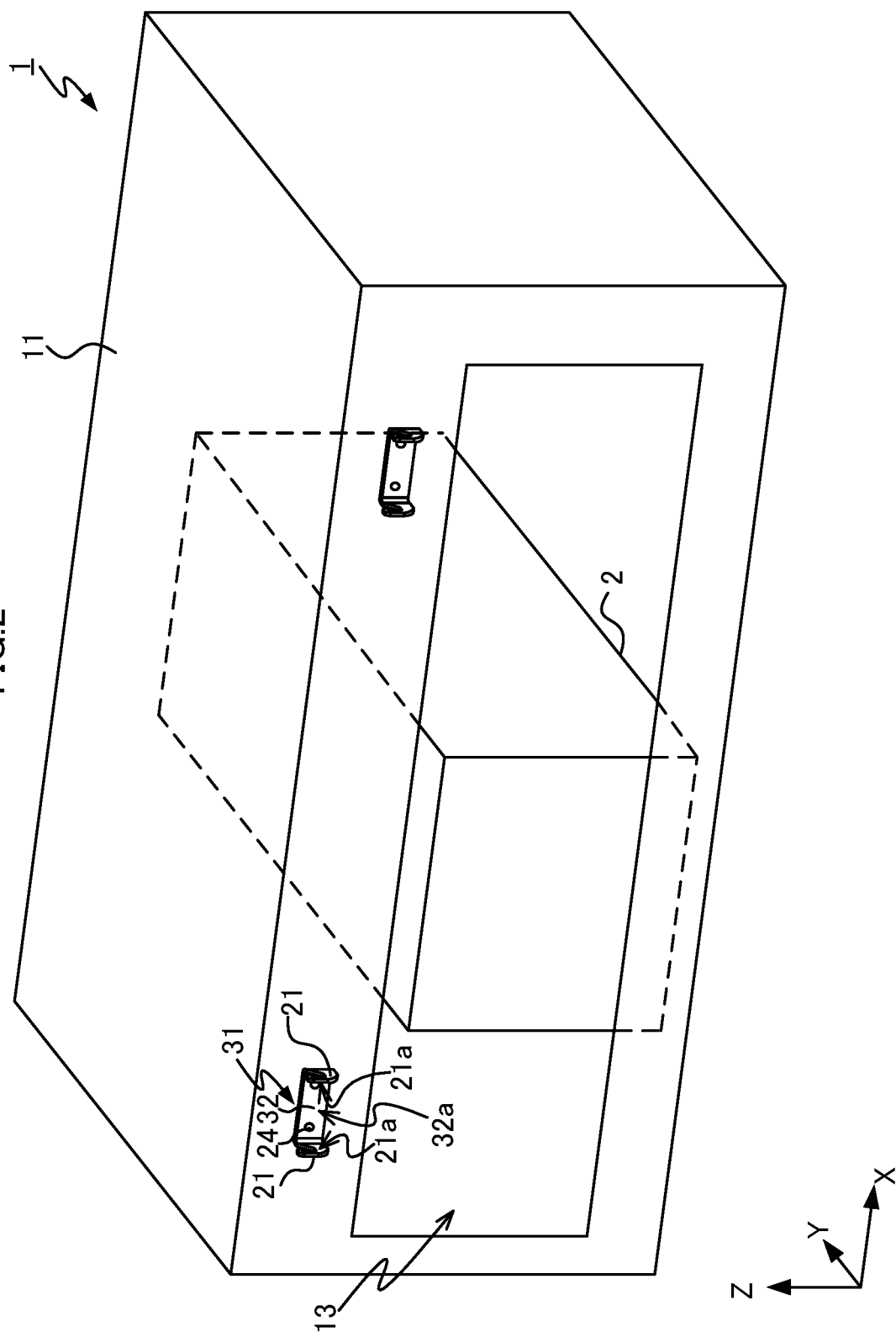
FIG. 2 is a perspective view of a housing according to Embodiment 1.

With reference to FIG. 1, a control device 1 for a railway vehicle (hereinafter referred to as "control device") includes a housing 11 and a cover 12. With reference to FIG. 2, the housing 11 is provided with an opening 13. In FIGS. 1 and 2, the Z axis indicates the vertical direction, the Y axis indicates the direction in which the opening 13 penetrates the housing 11, and the X axis indicates the direction orthogonal to the Y and Z axes. The control device 1 is installed underneath the floor of a railway vehicle. The control device 1 further includes a control unit 2 as a device for controlling the railway vehicle. The control unit 2 is accommodated in the housing 11 of the control device 1. The control unit 2 includes a power converter, a circuit breaker, a transformer, a reactor, and other components.

As illustrated in FIG. 1, the cover 12 is suspended at both ends by two suspension fittings 20 disposed apart from each other in the horizontal direction. The two suspension fittings 20 are located at the same height on the Z axis. The two suspension fittings 20 are spaced from each other in the X-axis direction. The cover 12 covers the opening 13. The cover 12 suspended by the two suspension fittings 20 is rotated about a rotational axis AX represented by the dashed-dotted line in FIG. 1, and thereby opens or closes the opening 13. The rotational axis AX extends through notch portions, which is described later, provided to a pair of first members 21 of each of the two suspension fittings 20, that is, the notch portions of the four first members 21. The rotational axis AX is parallel to the X axis. Since the two suspension fittings 20 have the identical structure, the following description is directed to only one of the suspension fittings 20 in order to facilitate an understanding. Here, the two suspension fittings 20 simultaneously operate in the same manner. The suspension fitting 20 has a pair of first members 21 and a second member 22 having a plate shape. The pair of first members 21 is attached to the housing 11. Specifically, the pair of first members 21 is attached to the housing with the pair of first members 21 facing each other in the X-axis direction and suspends the second member 22. The second member 22 having a plate shape is attached to the cover 12 with rivets 23. The second member 22 engages with the pair of first members 21 and is suspended by the pair of first members 21. The second member 22 has main surfaces 22a one of which is in contact with a main surface 12a of the cover 12.

Figure 3:
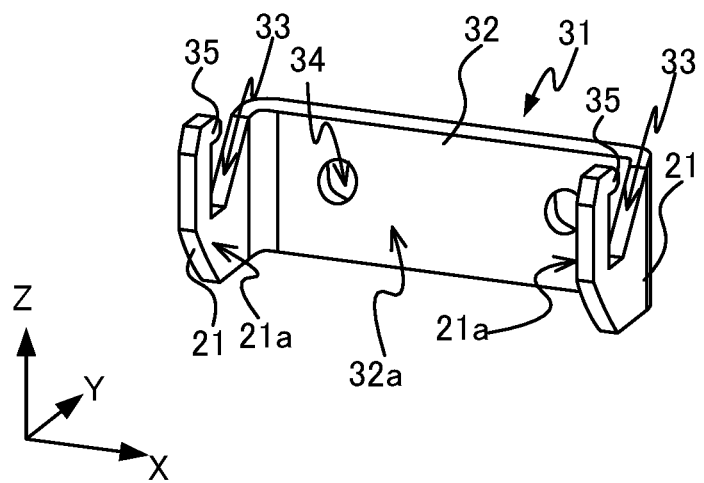
FIG. 3 is a perspective view of a pair of first members according to Embodiment 1.

The components of the control device 1 are described below in detail. As illustrated in FIG. 2, the pair of first members 21 includes a first metal plate 31 having bent end portions. The first metal plate 31 has a central portion 32 disposed between the end portions. The central portion 32 is attached to the housing 11 so as to attach the pair of first members 21 to the housing 11. In the example illustrated in FIGS. 1 and 2, the central portion 32 is fixed with rivets 24 to a surface of the housing 11 provided with the opening 13. The central portion 32 has a main surface 32a orthogonal to the horizontal direction. Main surfaces of the end portions of the first metal plate 31, that is, main surfaces 21a of the pair of first members 21 face each other in the horizontal direction. With reference to FIG. 3, each of the pair of first members 21 has a notch portion 33. The notch portion 33 extends from the vertically upper surface to the vertically lower surface. The central portion 32 has rivet holes 34 through which the respective rivets 24 are inserted. Each of the pair of first members 21 also has a protrusion 35, as illustrated in FIG. 3. The protrusion 35 is disposed apart from the lower bottom of the edge of the notch portion 33 in the positive Z-axis direction.

Figure 4:
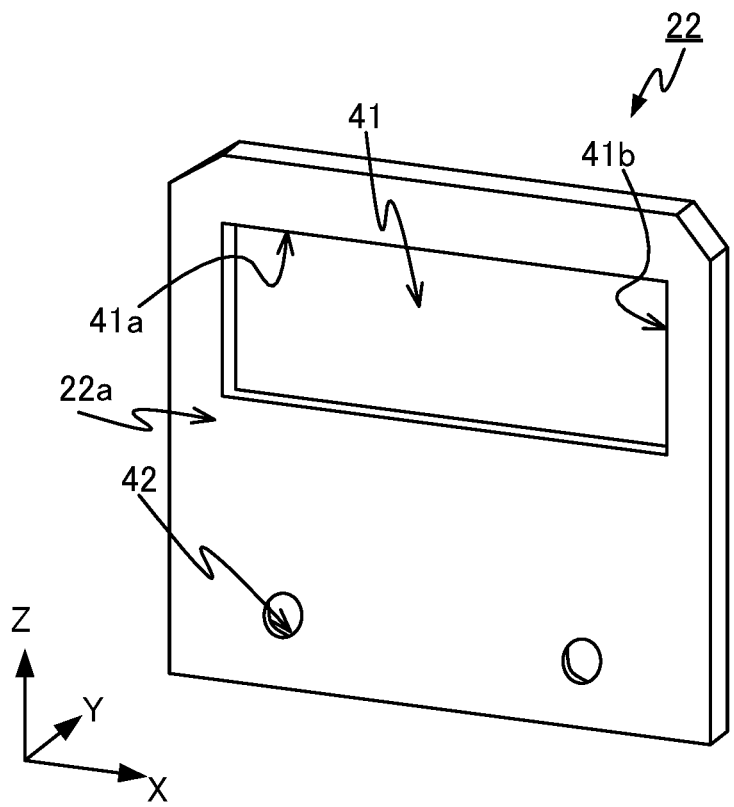
FIG. 4 is a perspective view of a second member according to Embodiment 1.

With reference to FIG. 4, the second member 22 has a hole portion 41 including a through hole penetrating both of the main surfaces 22a. The second member 22 also has rivet holes 42 through which the respective rivets 23 are inserted. The second member 22 is detachably attached to the first members 21. Specifically, an edge 41a of the hole portion 41 comes into contact with the lower bottoms of the edges of the notch portions 33. The contact of the edge 41a of the hole portion 41 with the lower bottoms of the edges of the notch portions 33 causes the second member 22 to be supported by the pair of first members 21. Furthermore, the second member 22 is supported by the pair of first members 21 at the edge 41a of the hole portion 41. The contact of edges 41b of the hole portion 41 with the pair of first members 21 restricts displacement of the second member 22. Specifically, the edges 41b are in contact with the pair of first members 21 in the horizontal direction, which results in restricting horizontal displacement of the second member 22. The above-described structure allows the second member 22 to rotate about the rotational axis AX illustrated in FIG. 1. The second member 22 is attached to the cover 12 and rotates about the rotational axis AX integrally with the cover 12, and can thereby open or close the opening 13.

Figure 5:
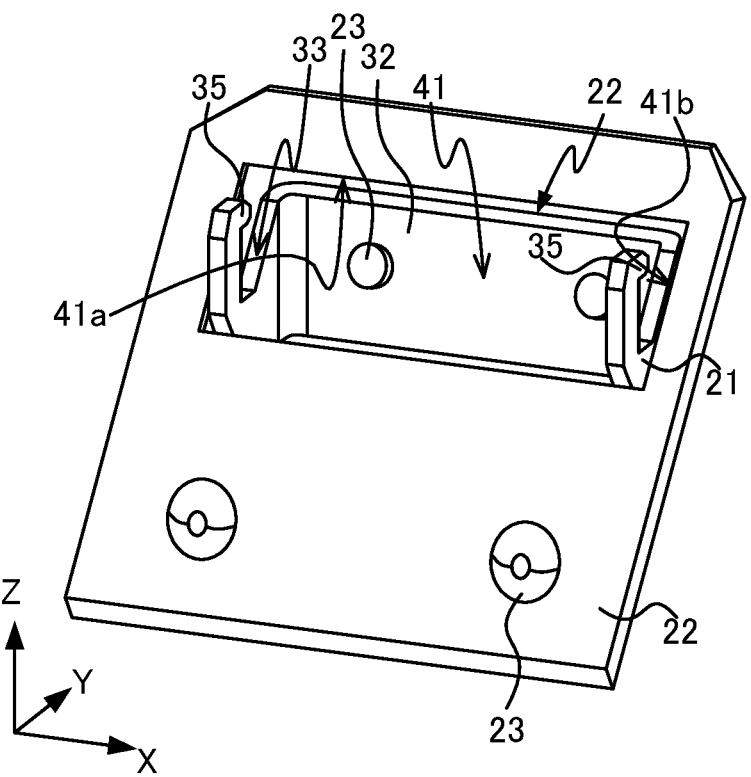
FIG. 5 is a perspective view of the first and second members according to Embodiment 1.
Figure 6:
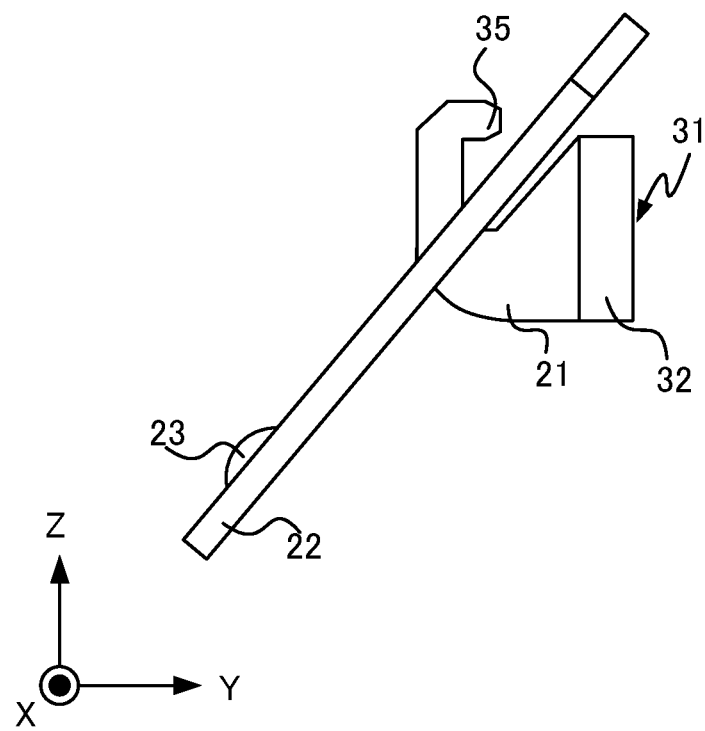
FIG. 6 is a side view of the first and second members according to Embodiment 1.
Figure 7:
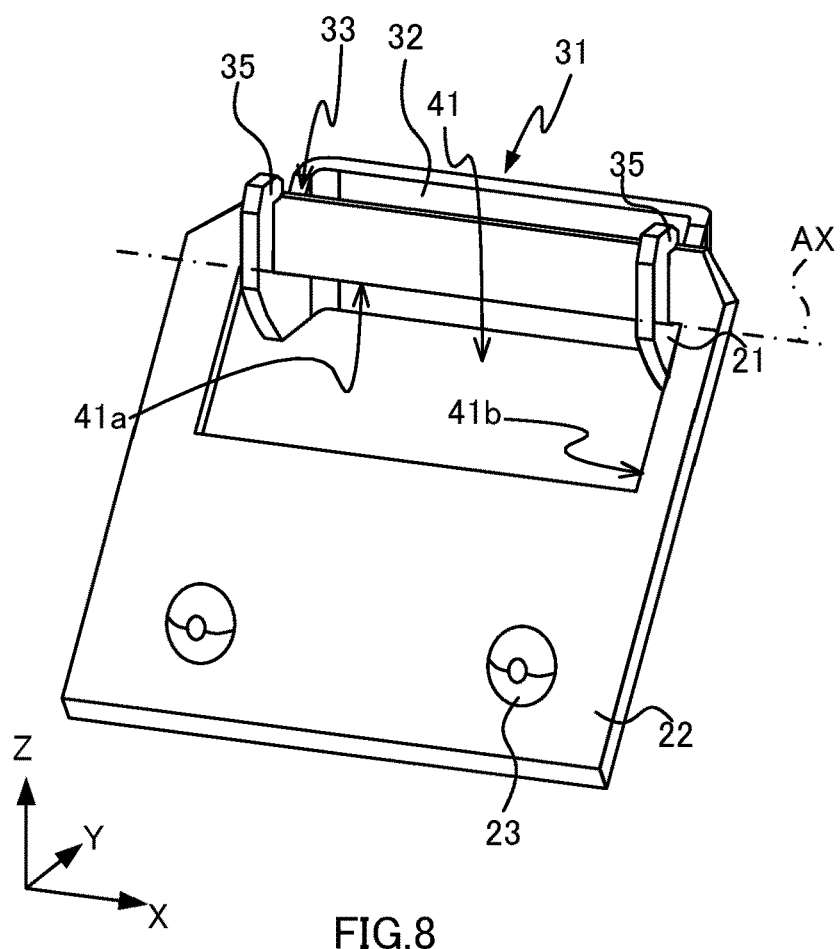
FIG. 7 is a perspective view of the first and second members according to Embodiment 1.
Figure 8:
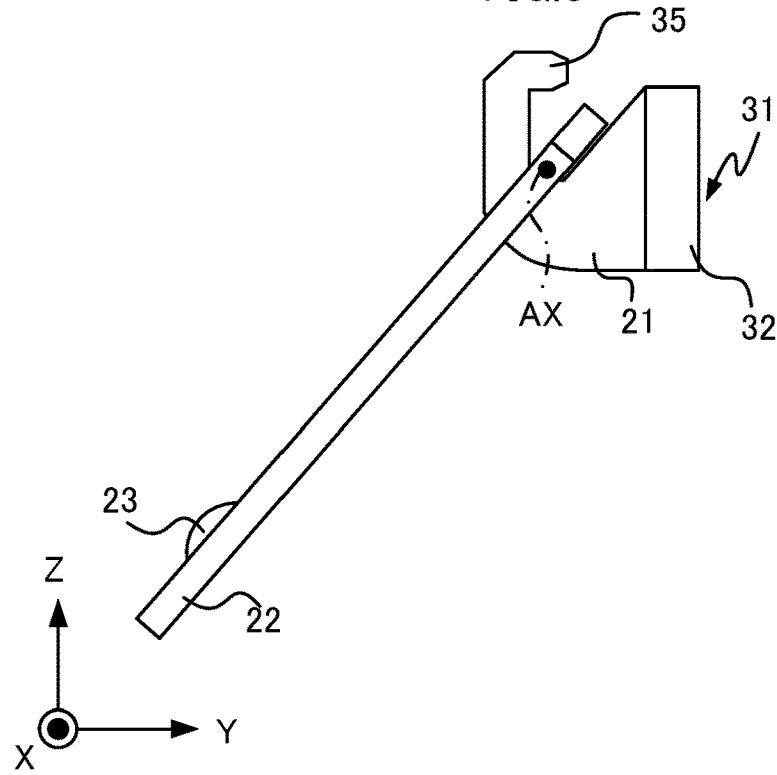
FIG. 8 is a side view of the first and second members according to Embodiment 1.
Figure 9:
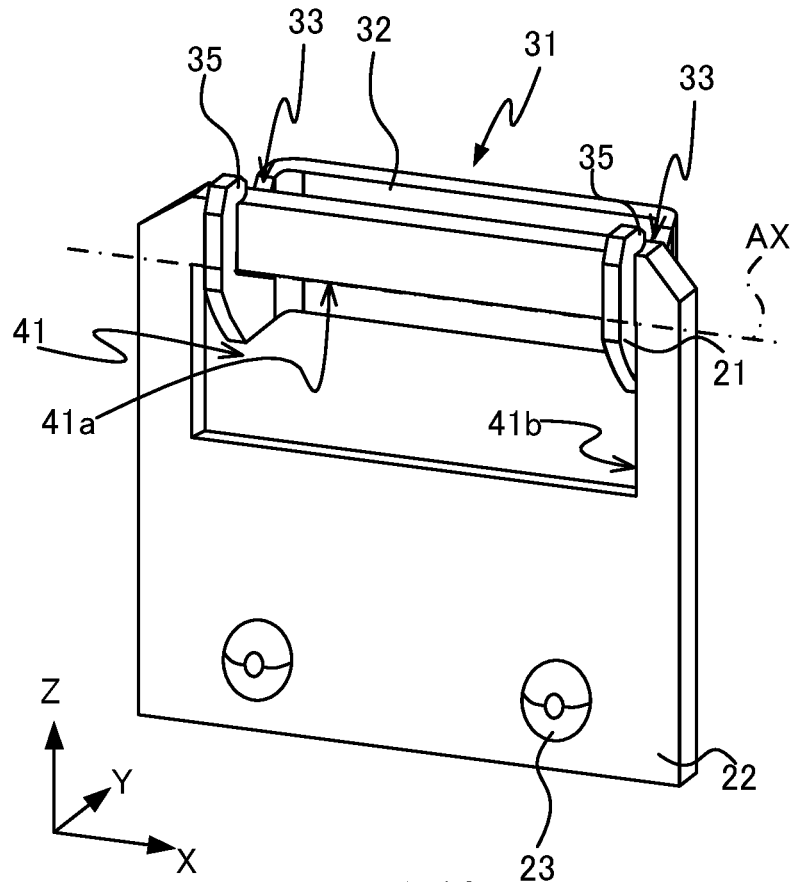
FIG. 9 is a perspective view of the first and second members according to Embodiment 1.
Figure 10:
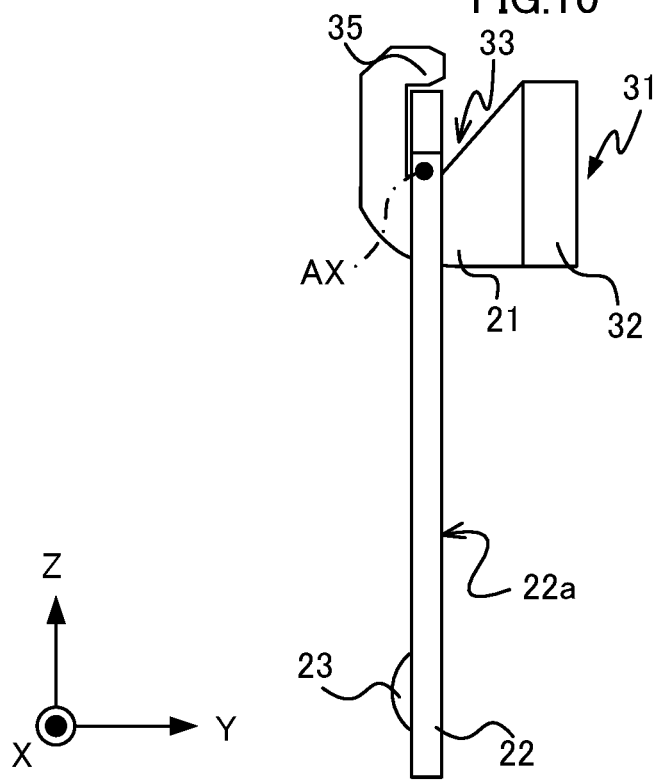
FIG. 10 is a side view of the first and second members according to Embodiment 1.

A procedure of attaching the second member 22 to the first members 21 is explained below with reference to FIGS. 5 to 10. FIGS. 5 to 10 do not illustrate the housing 11 provided with the first members 21 or the cover 12 provided with the second member 22. FIGS. 5, 7, and 9 are each a perspective view of the first members 21 and the second member 22. FIGS. 6, 8, and 10 are each a side view of the first members 21 and the second member 22 in each of respective FIGS. 5, 7, and 9, as viewed from the positive X-axis direction. The pair of first members 21 is first inserted in the hole portion 41, as illustrated in FIGS. 5 and 6. The second member 22 is inserted in the notch portions 33, as illustrated in FIGS. 7 and 8, so as to bring the edge 41a of the hole portion 41 into contact with the lower bottoms of the notch portions 33. The second member 22 is supported by the first members 21 so as to be rotatable about the rotational axis AX represented by the dashed-dotted line in FIG. 7. The second member 22 rotates about the rotational axis AX from the position illustrated in FIGS. 7 and 8 to the position illustrated in FIGS. 9 and 10. In FIG. 10, the lower bottoms of the notch portions 33 are located at the position in which one of the main surfaces 22a of the second member 22 is regarded to be matched with the main surface 12a of the cover 12. Each of the protrusions 35 extends above the lower bottom of the notch portion 33, which is located at the above-described position, on the side of the positive Z-axis direction. The width of a gap between the notch portion 33 and the central portion 32 in the Y-axis direction is regarded to be equal to the thickness of the cover 12 in the Y-axis direction. The above-explained processes are performed in a reversed order in detachment of the second member 22 from the first members 21.

Figure 11:
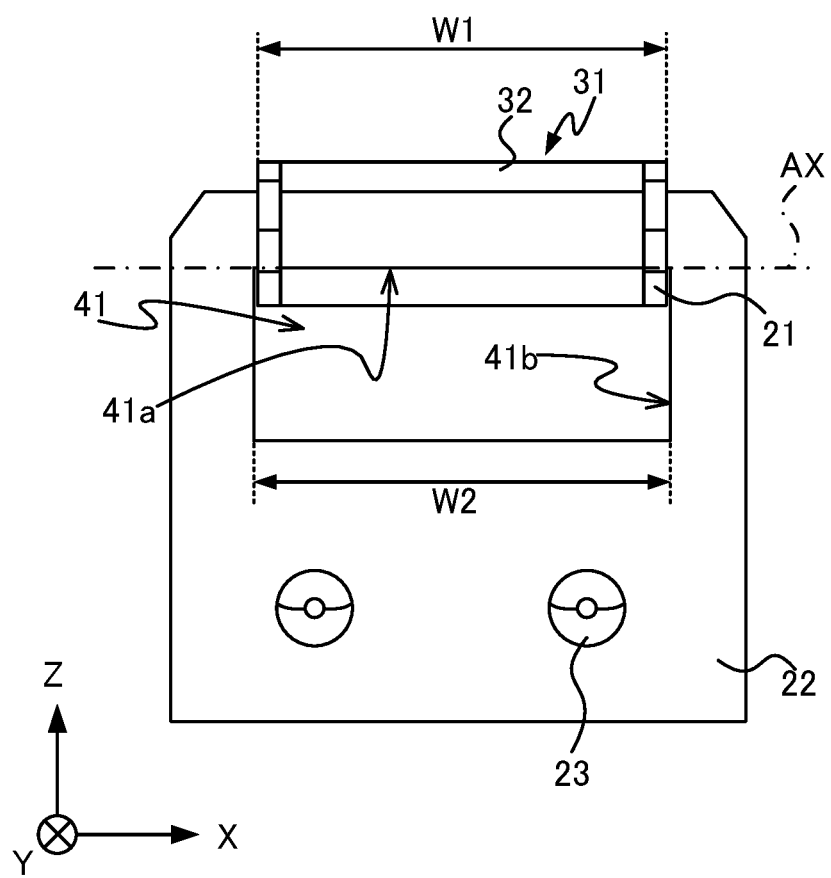
FIG. 11 is a front view of the first and second members according to Embodiment 1.

As described above, the second member 22 is rotatable about the rotational axis AX but is restricted to be displaced in the horizontal direction. With reference to FIG. 11, the width of a gap between the pair of first members 21 in the horizontal direction is defined as W1, and the width of the hole portion 41 in the horizontal direction is defined as W2. Here, W1, which is a width of the gap between the pair of first members 21 in the horizontal direction, indicates the distance between the outer main surfaces of the pair of first members 21. By making the width W2 slightly larger than the width W1, the edges 41b of the hole portion 41 are in contact with the pair of first members 21 in the horizontal direction. This configuration restricts horizontal displacement of the second member 22. The configuration can thus prevent the cover 12 from being detached by horizontal displacement of the second member 22. The second member 22 is also restricted to be displaced in the vertical direction, while the opening 13 is closed by the cover 12, that is, while in a state as illustrated in FIG. 10. The protrusions 35 are disposed apart from the second member 22 in the positive Z-axis direction, as illustrated in FIG. 10, and thus, when the second member 22 is displaced in the positive Z-axis direction, the second member 22 comes into contact with the protrusions 35. This configuration restricts vertical displacement of the second member 22 while the opening 13 is closed by the cover 12. The above-described restriction of horizontal and vertical displacement of the second member 22 can prevent detachment of the cover 12.

As described above, in the control device 1 according to Embodiment 1, the second member 22 is supported by the pair of first members 21 so as to be rotatable about the rotational axis AX while being in contact with the lower bottoms of the notch portions 33, and the second member 22 is in contact with the pair of first members 21 in the horizontal direction and can thereby prevent detachment of the cover 12. Furthermore, the structure of the control device 1 can be simplified since the first members 21 is fabricable by bending the first metal plate 31 and the second member 22 is fabricable by providing a metal plate with a through hole.

Embodiment 2

Figure 12:
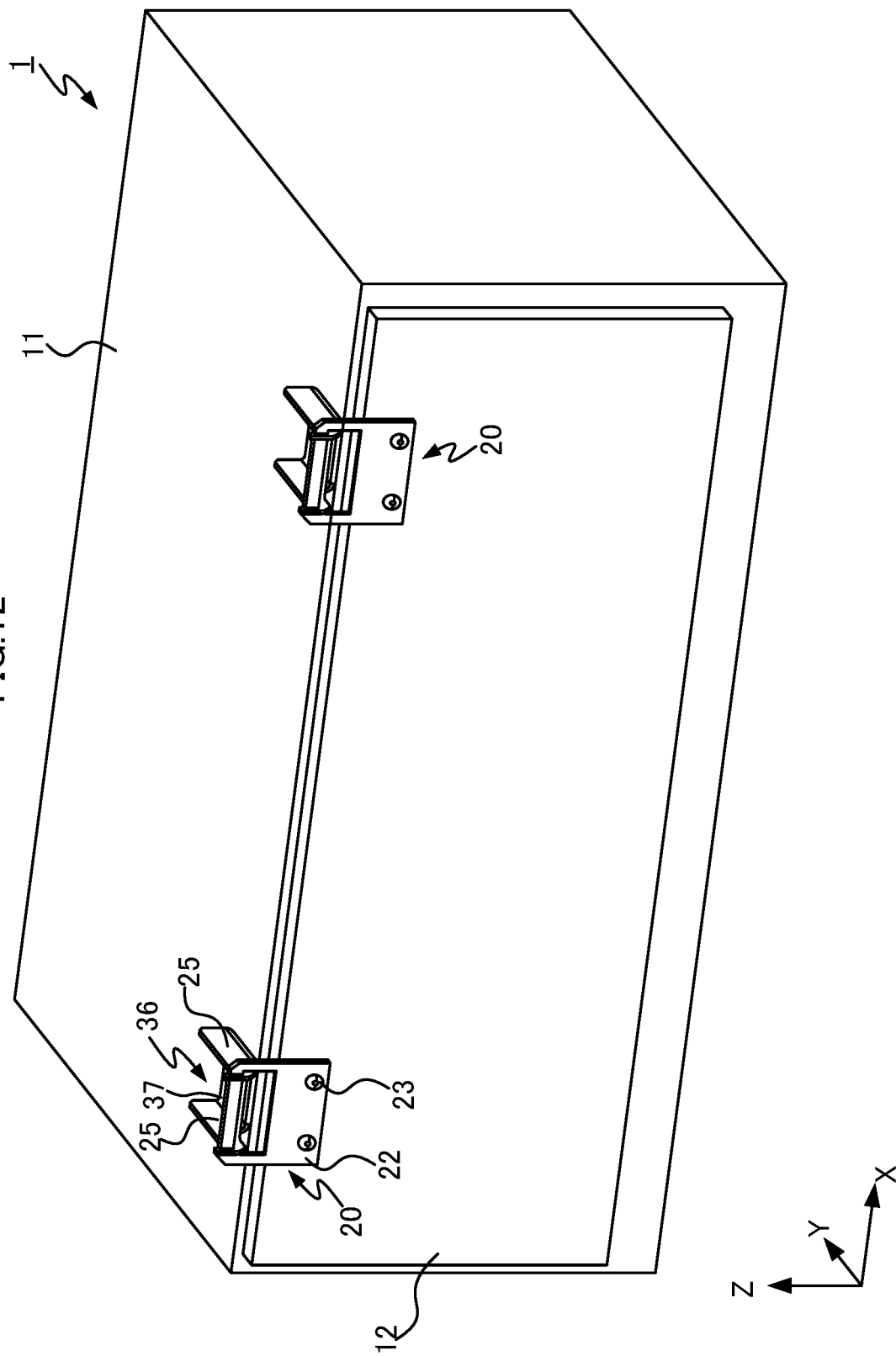
FIG. 12 is a perspective view of a control device for a railway vehicle according to Embodiment 2 of the present disclosure.

Although the pairs of first members 21 are attached to the surface of the housing 11 provided with the opening 13 according to the above-described embodiment, these attachment positions are each a mere example. In the control device 1 according to Embodiment 2, each pair of first members 25 are attached to a vertically upper surface of the housing 11, as illustrated in FIG. 12. The second members 22 have the shape identical to that in Embodiment 1.

The pair of first members 25 includes a first metal plate 36 having bent end portions. The first metal plate 36 has a central portion 37 disposed between the end portions. The central portion 37 is attached to the vertically upper surface of the housing 11 so as to attach the pair of first members 25 to the housing 11. The central portion 37 is fixed with non-illustrated rivets to the vertically upper surface of the housing 11. The central portion 37 has a main surface orthogonal to the vertical direction. Main surfaces of the end portions of the first metal plate 36, that is, the main surfaces of the pair of first members 25 face each other in the horizontal direction.

Figure 13:
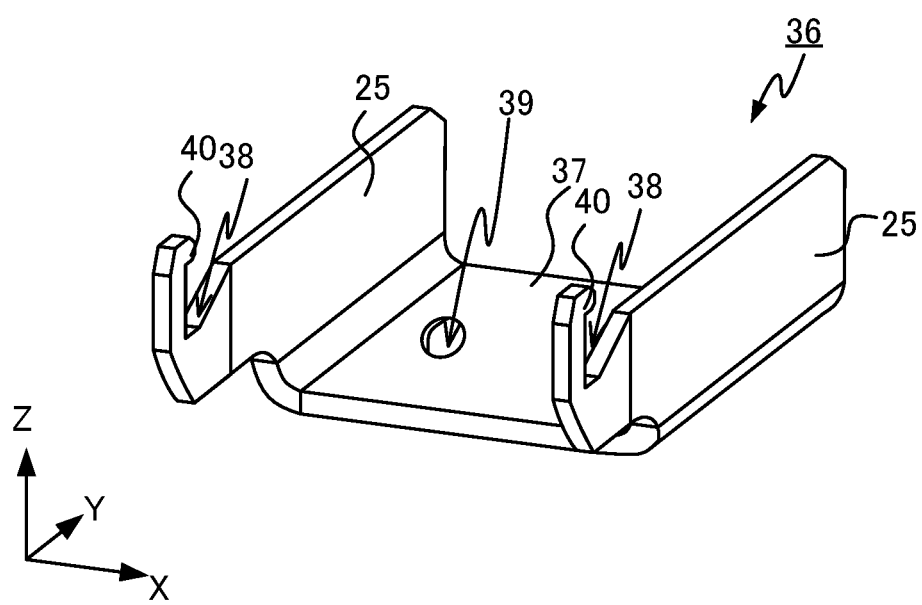
FIG. 13 is a perspective view of a first member according to Embodiment 2.

With reference to FIG. 13, each of the pair of first members 25 has a notch portion 38. The notch portion 38 extends from the vertically upper surface to the vertically lower surface. The central portion 37 has rivet holes 39 through which the respective non-illustrated rivets are inserted. Each of the pair of first members 25 also has a protrusion 40, as illustrated in FIG. 13. The protrusion 40 is disposed apart from the lower bottom of the edge of the notch portion 38 in the positive Z-axis direction.

The edge 41a of the hole portion 41 is in contact with the lower bottoms of the notch portions 38 of the pair of first members 25. The contact of the edge 41a of the hole portion 41 with the lower bottoms of the notch portions 38 causes the second member 22 to be supported by the pair of first members 25 so as to be rotatable about the rotational axis. Furthermore, the contact of the edges 41b of the hole portion 41 with the pair of first members 25 in the horizontal direction restricts horizontal displacement of the second member 22. The configuration can thus prevent the cover 12 from being detached by horizontal displacement of the second member 22. The second member 22 is also restricted to be displaced in the vertical direction, while the opening 13 is closed by the cover 12, that is, while in a state as illustrated in FIG. 12. Specifically, the protrusions 40 are disposed apart from the second member 22 in the positive Z-axis direction, and thus, when the second member 22 is displaced in the positive Z-axis direction, the second member 22 comes into contact with the protrusions 40. This configuration restricts vertical displacement of the second member 22 while the opening 13 is closed by the cover 12. The above-described restriction of horizontal and vertical displacement of the second member 22 can prevent detachment of the cover 12.

As described above, in the control device 1 according to Embodiment 2, the second member 22 is supported by the pair of first members 25 so as to be rotatable about the rotational axis AX while being in contact with the lower bottoms of the notch portions 38, and the second member 22 is in contact with the pair of first members 25 in the horizontal direction and can thereby prevent detachment of the cover 12. Furthermore, the structure of the control device 1 can be simplified since the first members 25 is fabricable by bending the first metal plate 36 and the second member 22 is fabricable by providing a metal plate with a through hole.

Embodiment 3

Figure 14:
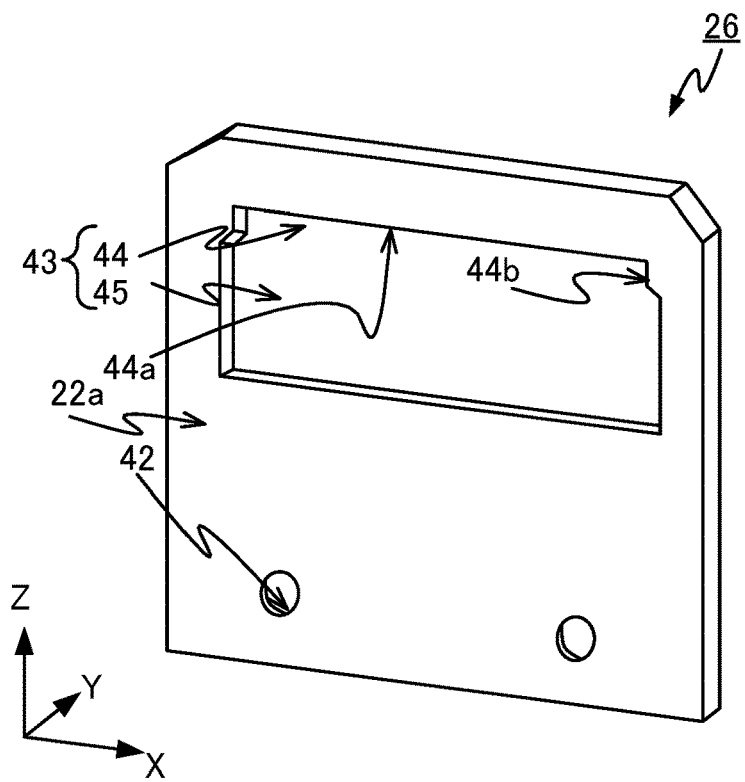
FIG. 14 is a perspective view of a second member according to Embodiment 3 of the present disclosure.
Figure 15:
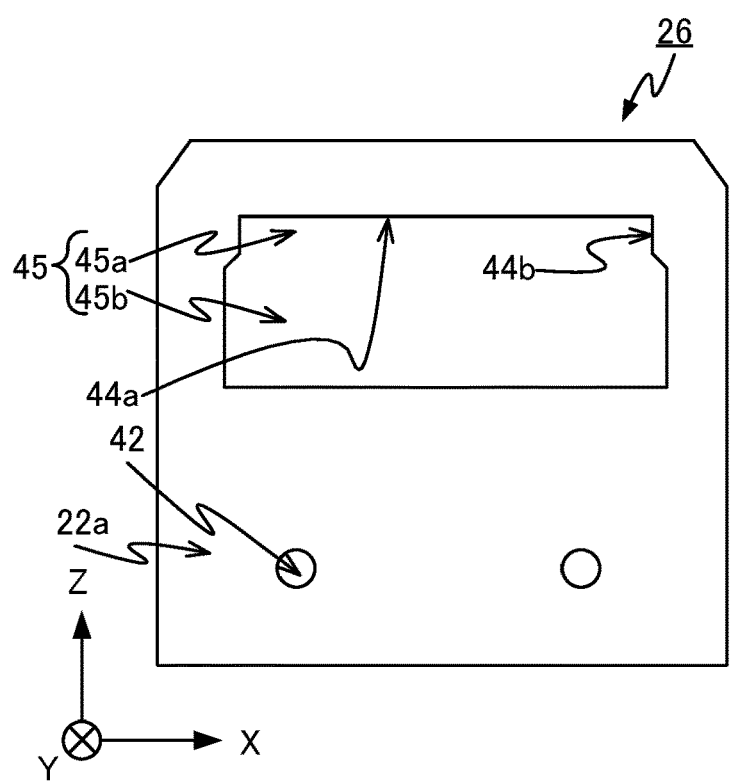
FIG. 15 is a front view of the second member according to Embodiment 3.

The second members 22 may each have a shape other than the above-described shape. The control device 1 according to Embodiment 3 has the configuration identical to that of the control device 1 according to Embodiment 1, except for the shape of the second members 22. In Embodiment 1, the hole portion 41 of the second member 22 has a constant width in the direction of alignment of the pair of first members 21, that is, in the X-axis direction. In contrast, in Embodiment 3, second members 26 each have a hole portion 43 of which a width in the X-axis direction is not constant. As illustrated in FIGS. 14 and 15, the hole portion 43 includes a first hole segment 44 penetrating both of the main surfaces 22a and a second hole segment 45 penetrating both of the main surfaces 22a. The second hole segment 45 communicates with the first hole segment 44 and has a larger width in the X-axis direction than the first hole segment 44. An edge 44a of the first hole segment 44 is in contact with the lower bottoms of the notch portions 33 of the pair of first members 21. The contact of the edge 44a of the first hole segment 44 with the lower bottoms of the notch portions 33 causes the second member 26 to be supported by the pair of first members 21 so as to be rotatable about the rotational axis AX.

Figure 16:
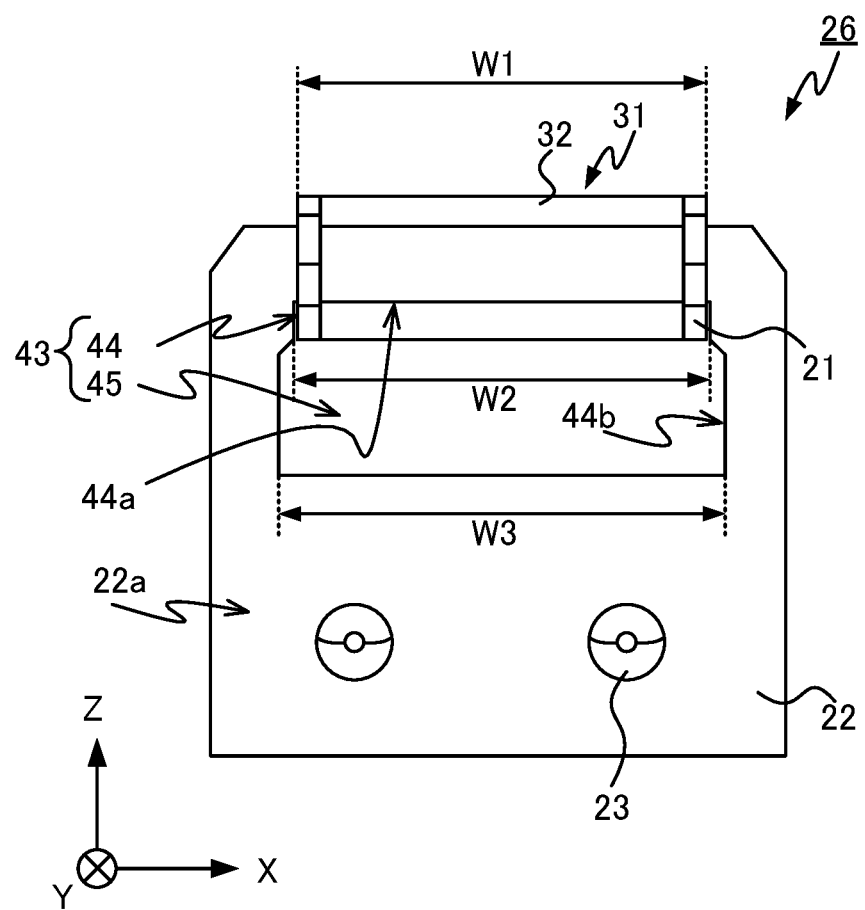
FIG. 16 is a front view of the first and second members according to Embodiment 3.

With reference to FIG. 16, the width of the gap between the pair of first members 21 in the horizontal direction is defined as W1, the width of the first hole segment 44 in the horizontal direction is defined as W2, and the width of the second hole segment 45 in the horizontal direction is defined as W3. By making the width W2 slightly larger than the width W1, edges 44b of the first hole segment 44 are in contact with the pair of first members 21 in the horizontal direction. This configuration restricts horizontal displacement of the second member 26. By making the width W3 sufficiently larger than the width W2, the second member 26 can be readily attached to the first members 21.

As described above, in the control device 1 according to Embodiment 3, each of the second members 26 has the hole portion 43 including the first hole segment 44 and the second hole segment 45. This configuration facilitates attachment of the second member 26 to the first members 21.

Embodiment 4

Figure 17:
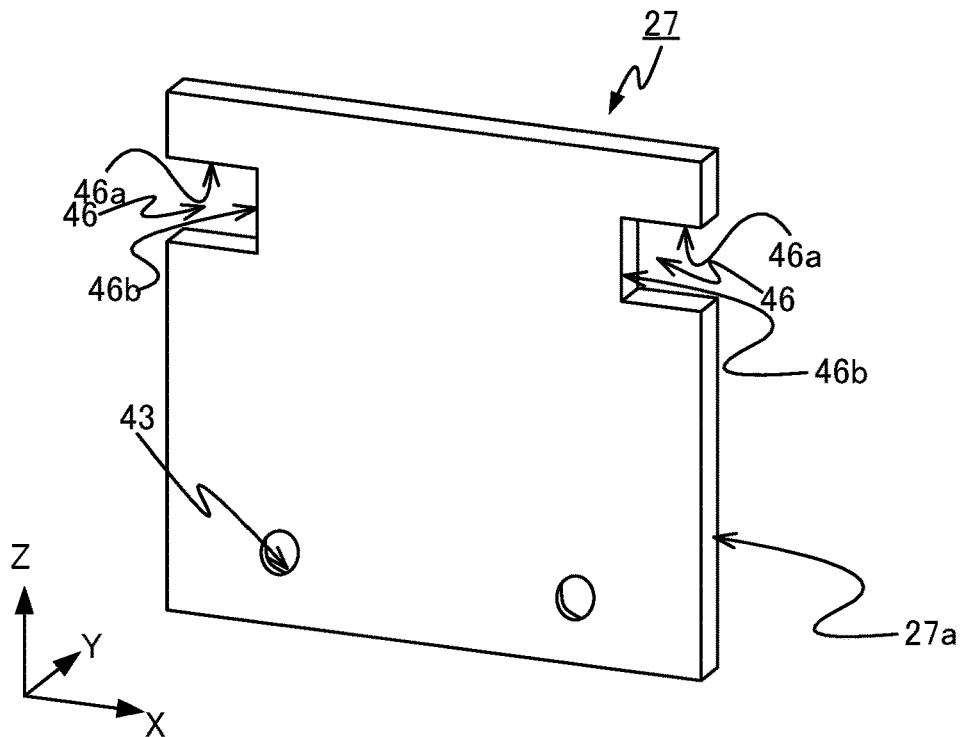
FIG. 17 is a perspective view of a second member according to Embodiment 4 of the present disclosure.
Figure 18:
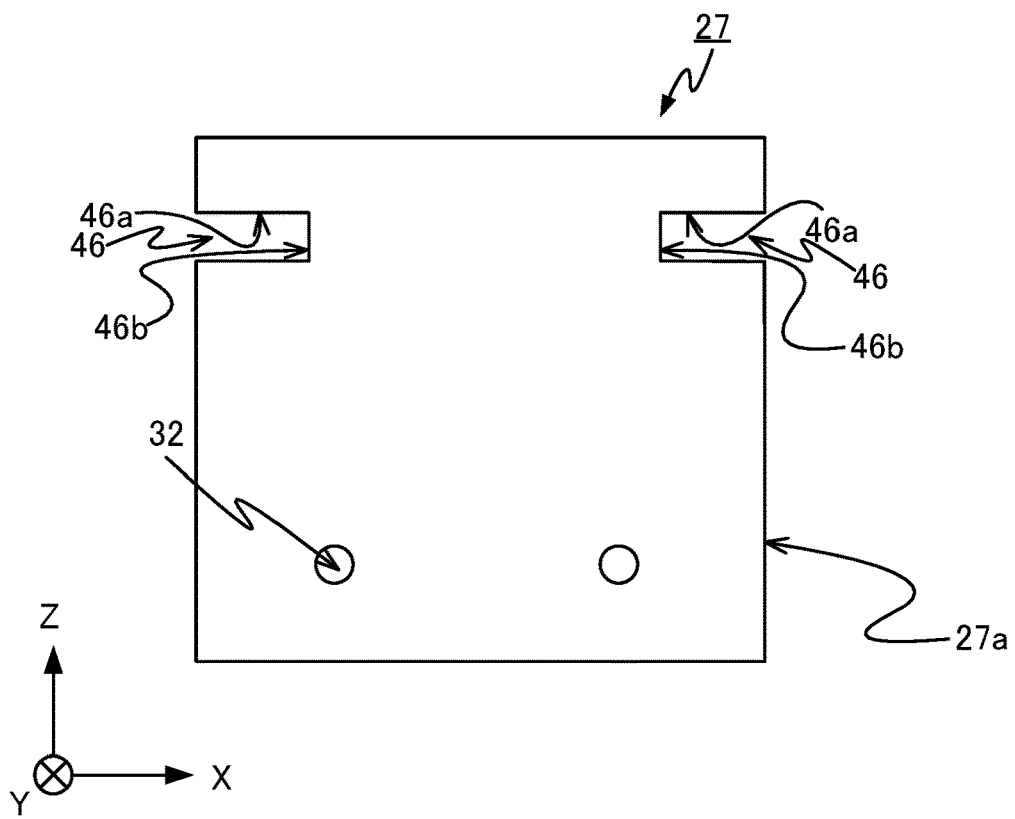
FIG. 18 is a front view of the second member according to Embodiment 4.

The second members 22 may have a shape other than the above-described shapes. In Embodiment 4, second members 27 each have hole portions 46 including a pair of notches, which extend from the respective side surfaces 27a in the mutually approaching directions, as illustrated in FIGS. 17 and 18. In the example illustrated in FIGS. 17 and 18, the pair of notches extends in the horizontal direction. Edges 46a of the hole portions 46 are in contact with the lower bottoms of the notch portions 33 of the pair of first members 21. The contact of the edges 46a of the hole portions 46 with the lower bottoms of the notch portions 33 causes the second member 27 to be supported by the pair of first members 21 so as to be rotatable about the rotational axis AX. Furthermore, the contact of edges 46b of the hole portions 46 with the pair of first members 21 in the horizontal direction restricts horizontal displacement of the second member 27.

Figure 19:
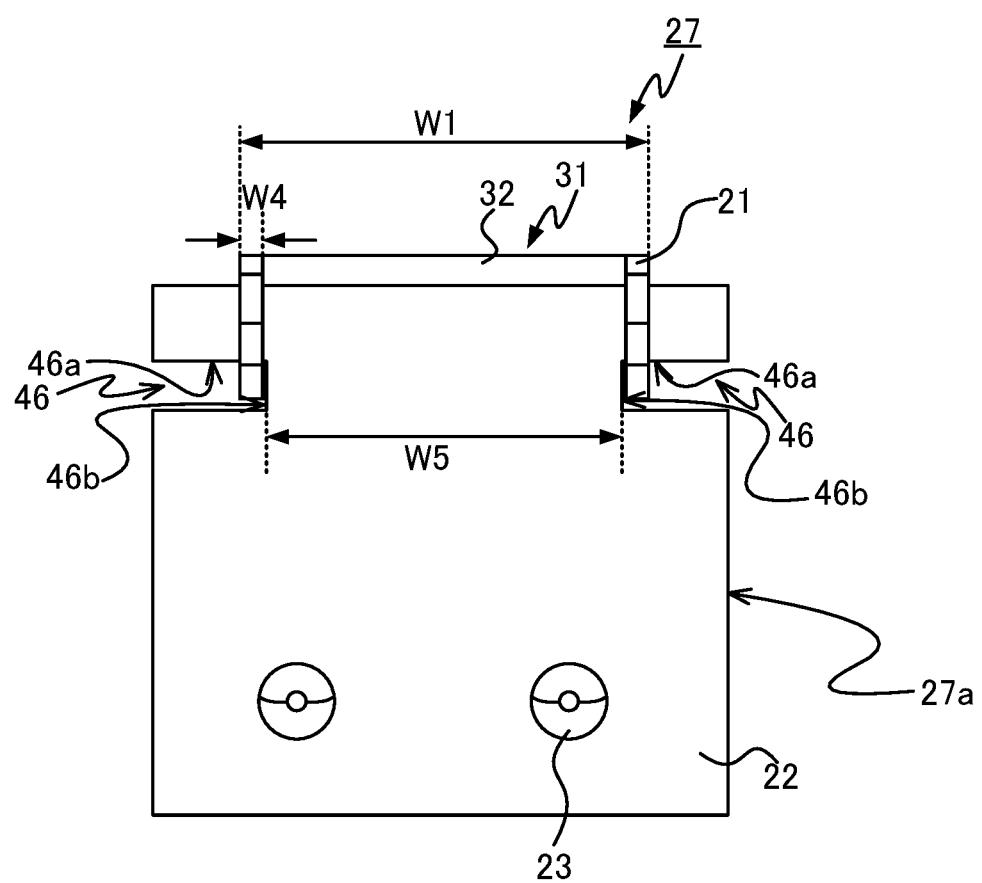
FIG. 19 is a front view of the first and second members according to Embodiment 4.

With reference to FIG. 19, the width of the gap between the pair of first members 21 in the horizontal direction is defined as W1, the thickness of each first member 21 in the horizontal direction is defined as W4, and the width of the gap between the pair of notches of the hole portions 46 in the horizontal direction is defined as W5. By making the length (W1-2W4) slightly larger than the width W5, the edges 46b of the hole portions 46 are in contact with the pair of first members 21 in the horizontal direction. This configuration restricts horizontal displacement of the second member 27.

As described above, in the control device 1 according to Embodiment 4, the second member 27 is supported by the pair of first members 21 so as to be rotatable about the rotational axis AX while being in contact with the lower bottoms of the notch portions 33, and the second member 27 is in contact with the pair of first members 21 in the horizontal direction and can thereby prevent detachment of the cover 12. Furthermore, the structure of the control device 1 can be simplified since the first members 21 is fabricable by bending the first metal plate 31 and the second member 27 is fabricable by providing a metal plate with a pair of notches.

Embodiment 5

Figure 20:
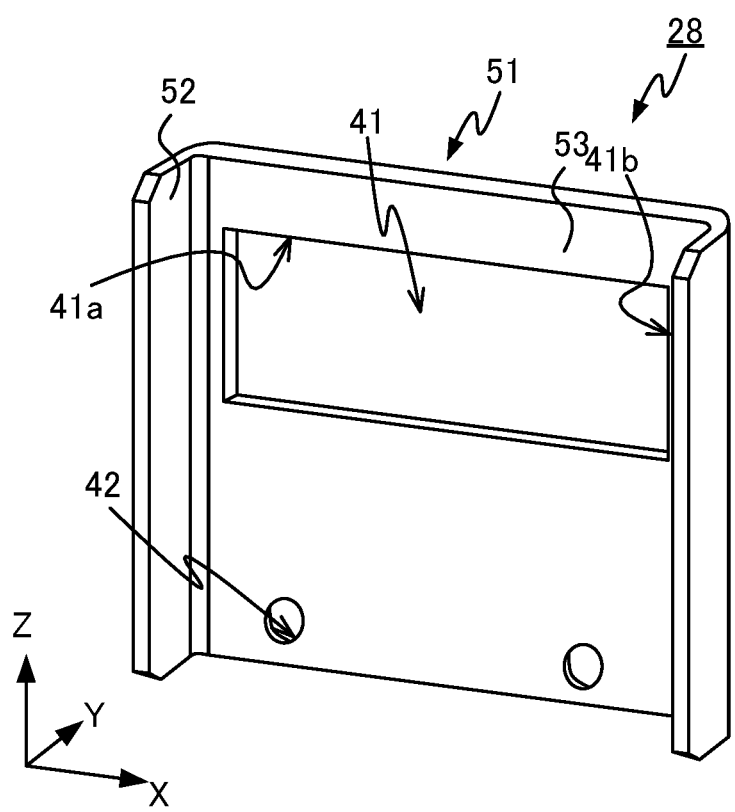
FIG. 20 is a perspective view of a second member according to Embodiment 5 of the present disclosure.

The second members may have a shape other than the above-described shapes. According to Embodiment 5, second members 28 each include a second metal plate 51 having bent end portions 52, as illustrated in FIG. 20. The second metal plate 51 is bent such that the end portions 52 face each other in the direction of alignment of the pair of first members 21, that is, in the X-axis direction. The second metal plate 51 has a central portion 53 disposed between the end portions 52. The central portion 53 has the hole portion 41. The second member 28 including the second metal plate 51 having the bent end portions 52 can obtain an increased strength.

The edge 41a of the hole portion 41 is in contact with the lower bottoms of the notch portions 33 of the pair of first members 21. The contact of the edge 41a of the hole portion 41 with the lower bottoms of the notch portions 33 causes the second member 28 to be supported by the pair of first members 21 so as to be rotatable about the rotational axis AX. Furthermore, the contact of the edges 41b of the hole portion 41 with the pair of first members 21 in the horizontal direction restricts horizontal displacement of the second member 28.

As described above, in the control device 1 according to Embodiment 5, the second member 28 including the second metal plate 51 having the bent end portions 52 has an increased strength.

Embodiment 6

Although the second members 22, 26, and 27 are independent from the cover 12 according to the above-described embodiments, the second members may be integrated with the cover. The control device 1 according to Embodiment 6 differs from the control device 1 according to Embodiment 1 in including a cover 14, in place of the cover 12 and the second members 22. The cover 14 serves as the second members in Embodiment 6. The cover 14 serving as the second members enables the control device 1 to have an increased strength.

Figure 21:
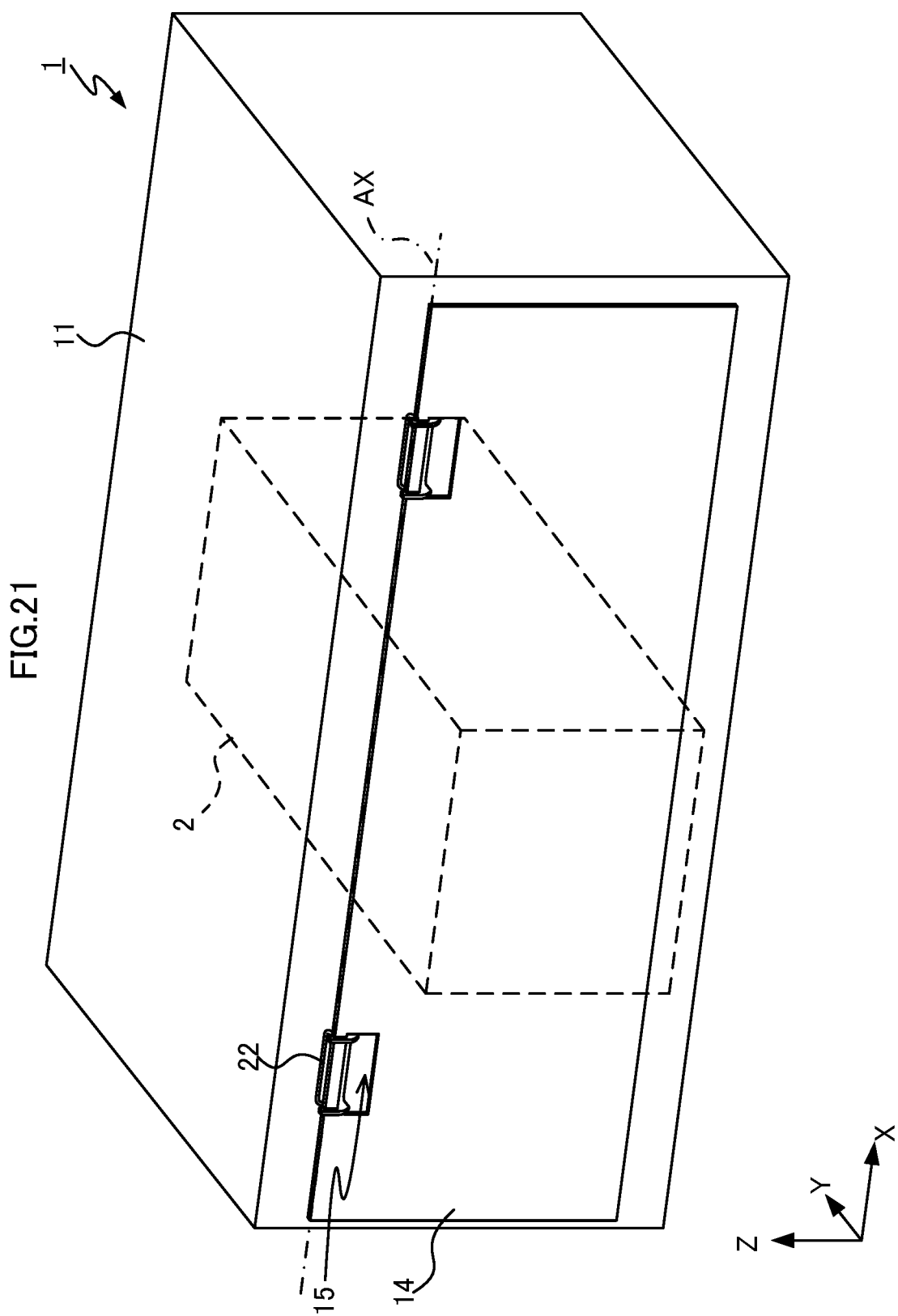
FIG. 21 is a perspective view of a control device for a railway vehicle according to Embodiment 6 of the present disclosure.
Figure 22:
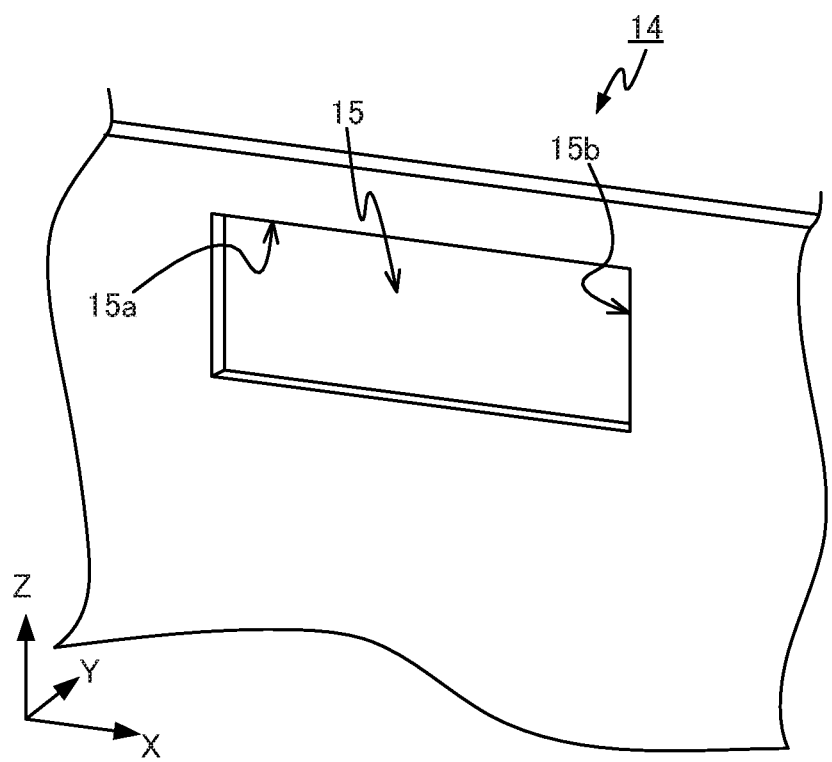
FIG. 22 is a perspective view of a cover according to Embodiment 6.

As illustrated in FIGS. 21 and 22, the cover 14 has hole portions 15 including through holes. An edge 15a of each of the hole portions 15 is in contact with the lower bottoms of the notch portions 33 of the pair of first members 21. The contact of the edge 15a of the hole portion 15 with the lower bottoms of the notch portions 33 causes the cover 14 to be supported by the pair of first members 21 so as to be rotatable about the rotational axis AX. Furthermore, the contact of edges 15b of the hole portion 15 with the pair of first members 21 in the horizontal direction restricts horizontal displacement of the cover 14. The configuration can thus prevent the cover 14 from being detached by horizontal displacement of the cover 14. The cover 14 is also restricted to be displaced in the vertical direction, while the opening 13 is closed by the cover 14, that is, while in a state as illustrated in FIG. 21. The protrusions 35 are disposed apart from the cover 14 in the positive Z-axis direction, and thus, when the cover 14 is displaced in the positive Z-axis direction, the cover 14 comes into contact with the protrusions 35. This configuration restricts vertical displacement of the cover 14 while the opening 13 is closed by the cover 14. The above-described restriction of horizontal and vertical displacement of the cover 14 can prevent detachment of the cover 14.

As described above, in the control device 1 according to Embodiment 6, the cover 14 enables the control device 1 to have an increased strength.

Embodiment 7

Figure 23:
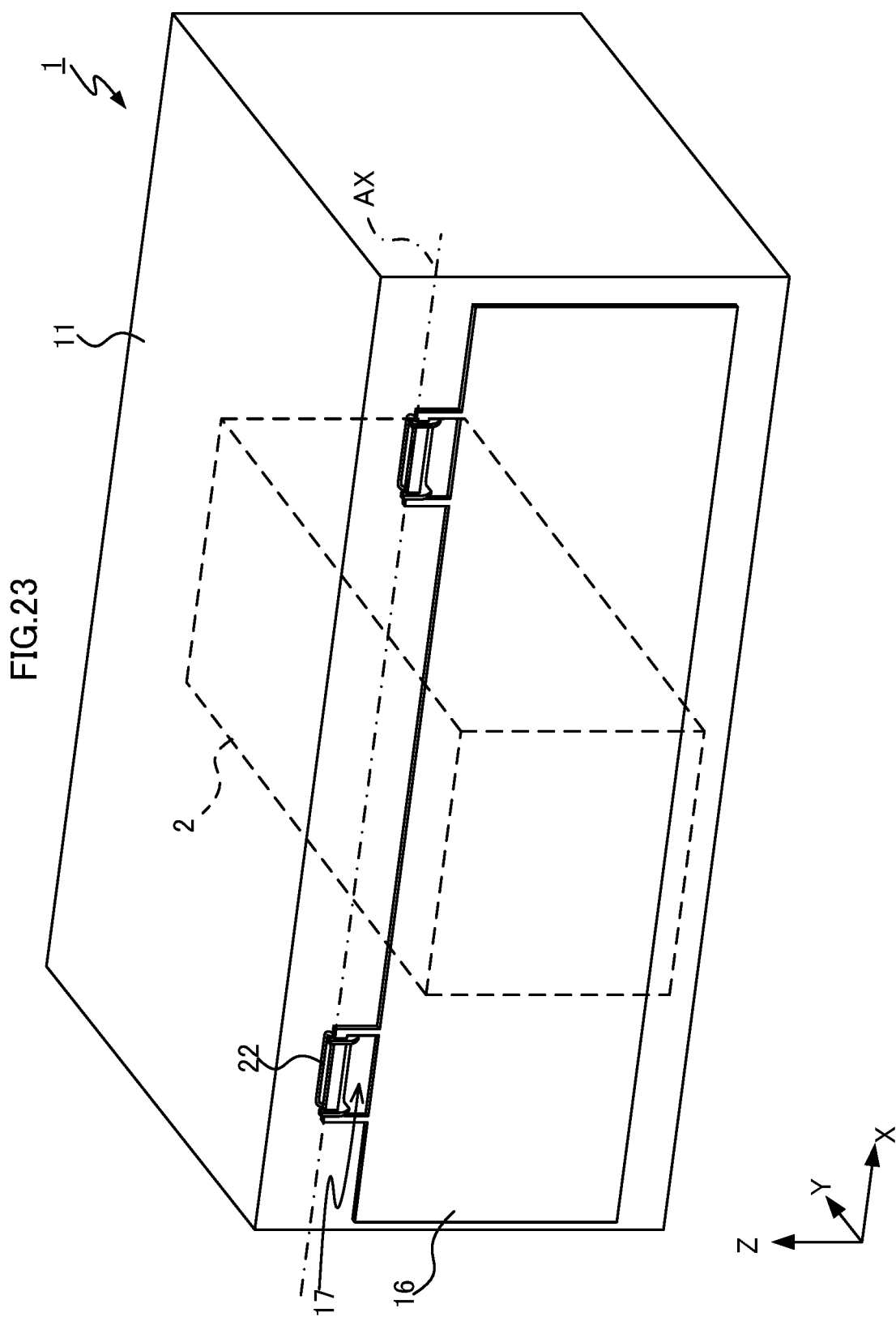
FIG. 23 is a perspective view of a control device for a railway vehicle according to Embodiment 7 of the present disclosure.

The cover serving as second members may have a shape other than that in Embodiment 6. With reference to FIG. 23, the control device 1 according to Embodiment 7 includes a cover 16. The control device 1 according to Embodiment 7 differs from the control device 1 according to Embodiment 1 in including the cover 16, in place of the cover 12 and the second members 22. The cover 16 serves as the second members in Embodiment 7. The cover 16 serving as the second members enables the control device 1 to have an increased strength.

Figure 24:
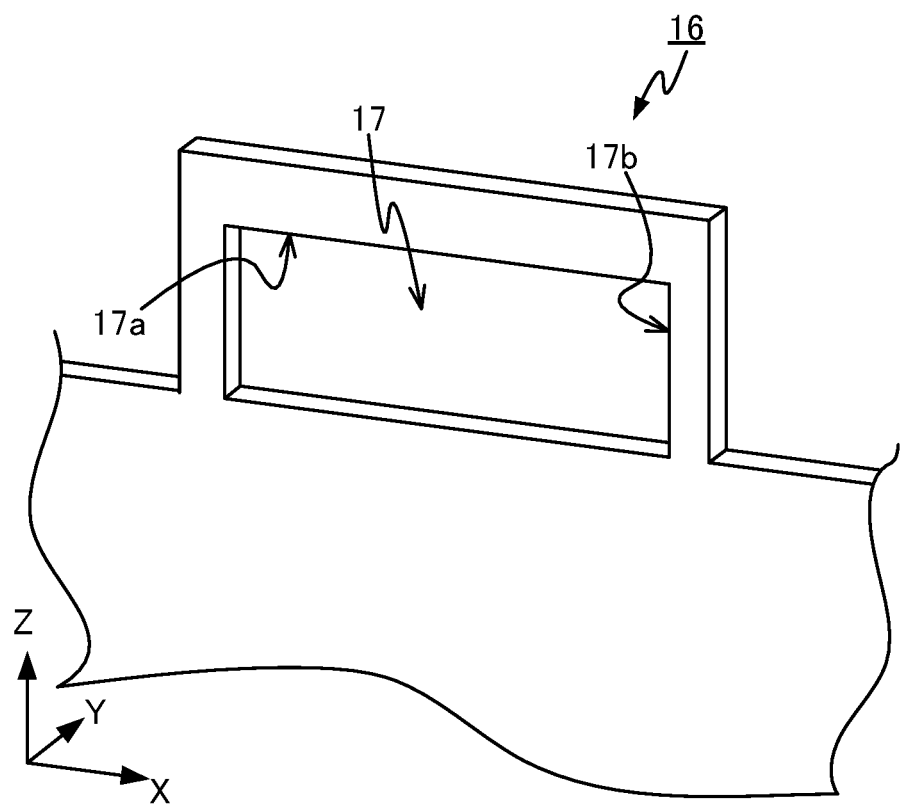
FIG. 24 is a perspective view of a cover according to Embodiment 7.

As illustrated in FIGS. 23 and 24, the cover 16 has hole portions 17 including through holes. An edge 17a of each of the hole portions 17 is in contact with the lower bottoms of the notch portions 33 of the pair of first members 21. The contact of the edge 17a of the hole portion 17 with the lower bottoms of the notch portions 33 causes the cover 16 to be supported by the pair of first members 21 so as to be rotatable about the rotational axis AX. Furthermore, the contact of edges 17b of the hole portion 17 with the pair of first members 21 in the horizontal direction restricts horizontal displacement of the cover 16. The configuration can thus prevent the cover 16 from being detached by horizontal displacement of the cover 16. The cover 16 is also restricted to be displaced in the vertical direction, while the opening 13 is closed by the cover 16, that is, while in a state as illustrated in FIG. 23. The protrusions 35 are disposed apart from the cover 16 in the positive Z-axis direction, and thus, when the cover 16 is displaced in the positive Z-axis direction, the cover 16 comes into contact with the protrusions 35. This configuration restricts vertical displacement of the cover 16 while the opening 13 is closed by the cover 16. The above-described restriction of horizontal and vertical displacement of the cover 16 can prevent detachment of the cover 16.

As described above, in the control device 1 according to Embodiment 7, the cover 16 enables the control device 1 to have an increased strength.

Some of the above-described embodiments may be arbitrarily combined. For example, the control device 1 may include the pair of first members 25 according to Embodiment 2 and the second member 22 according to Embodiment 2. Alternatively, the control device 1 may include the pair of first members 25 according to Embodiment 2 and the second member 26 according to Embodiment 3. Alternatively, the control device 1 may include the pair of first members 25 according to Embodiment 2 and the second member 27 according to Embodiment 4. Alternatively, the control device 1 may include the pair of first members 25 according to Embodiment 2 and the second member 28 according to Embodiment 5. Alternatively, the control device 1 may include the pair of first members 25 according to Embodiment 2 and the cover 14 or 16.

The above-described embodiments should not be construed as limiting the present disclosure. The opening 13 may be provided to a surface of the housing 11 intersecting the horizontal direction, the vertically upper or lower surface of the housing 11, or a surface of the housing 11 intersecting the vertical direction, instead of the surface of the housing 11 orthogonal to the horizontal direction. The configuration may include any number of suspension fittings 20. For example, a single suspension fitting 20 may be provided at the center of the cover 12 in the X-axis direction so as to suspend the cover 12.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Control device for a railway vehicle
2 Control unit
11 Housing
12, 14, 16 Cover
12a, 21a, 22a, 32a Main surface
13 Opening
15, 17, 41, 43, 46 Hole portion
15a, 15b, 17a, 17b, 41a, 41b, 44a, 44b, 46a, 46b Edge
20 Suspension fitting
21, 25 First member
22, 26, 27, 28 Second member
23, 24 Rivet
27a Side surface
31, 36 First metal plate
32, 37, 53 Central portion
33, 38 Notch portion
34, 39, 42 Rivet hole
35, 40 Protrusion
44 First hole segment
45 Second hole segment
51 Second metal plate
52 End portion
AX Rotational axis

The invention claimed is:
1. A control device for a railway vehicle, comprising:
a housing provided with an opening;
a cover to cover the opening;
a pair of first members to be attached to the housing; and
a second member having a plate shape, the second member being detachably attached to the pair of first members, wherein
each of the pair of first members has a notch portion,
the pair of first members includes a first metal plate having bent end portions and a central portion disposed between the end portions,
the central portion of the first metal plate is attached to the housing so as to attach the pair of first members to the housing,
the second member has a hole portion including a through hole penetrating both of main surfaces of the second member or including a pair of notches extending from respective side surfaces of the second member in mutually approaching directions, contact of an edge of the hole portion with vertically lower bottoms of edges of the notch portions causes the second member to be supported by the pair of first members so as to be rotatable about a rotational axis, contact of edges of the hole portion with the pair of first members restricts displacement of the second member, and the second member is attached to the cover and rotates integrally with the cover, to cause opening or closing of the opening.

2. The control device according to claim 1, wherein
the opening is provided to a surface of the housing orthogonal to a horizontal direction,
the central portion of the first metal plate has a main surface orthogonal to the horizontal direction,
the central portion of the first metal plate is attached to a surface of the housing provided with the opening, and
the end portions of the first metal plate have main surfaces facing each other in the horizontal direction.

3. The control device according to claim 2, wherein
the hole portion includes a first hole segment and a second hole segment, the first hole segment penetrating both of the main surfaces of the second member, the second hole segment penetrating both of the main surfaces of the second member and communicating with the first hole segment, the second hole segment having a width larger than a width of the first hole segment in a direction of alignment of the pair of first members, and
contact of an edge of the first hole segment with the lower bottoms of the edges of the notch portions causes the second member to be supported by the pair of first members so as to be rotatable about the rotational axis.

4. The control device according to claim 2, wherein the second member includes a second metal plate having bent end portions, the end portions facing each other in a direction of alignment of the pair of first members.

5. The control device according to claim 2, wherein each of the pair of first members comprises a protrusion, the protrusion being disposed above and apart from the second member in a vertical direction while the opening is closed by the cover.

6. The control device according to claim 2, wherein the second member is integrated with the cover.

7. The control device according to claim 1, wherein
the opening is provided to a surface of the housing orthogonal to a horizontal direction,
the central portion of the first metal plate has a main surface orthogonal to a vertical direction,
the central portion of the first metal plate is attached to a vertically upper surface of the housing, and
the end portions of the first metal plate have main surfaces facing each other in the horizontal direction.

8. The control device according to claim 7, wherein
the hole portion includes a first hole segment and a second hole segment, the first hole segment penetrating both of the main surfaces of the second member, the second hole segment penetrating both of the main surfaces of the second member and communicating with the first hole segment, the second hole segment having a width larger than a width of the first hole segment in a direction of alignment of the pair of first members, and
contact of an edge of the first hole segment with the lower bottoms of the edges of the notch portions causes the second member to be supported by the pair of first members so as to be rotatable about the rotational axis.

9. The control device according to claim 7, wherein the second member includes a second metal plate having bent end portions, the end portions facing each other in a direction of alignment of the pair of first members.

10. The control device according to claim 7, wherein each of the pair of first members comprises a protrusion, the protrusion being disposed above and apart from the second member in a vertical direction while the opening is closed by the cover.

11. The control device according to claim 7, wherein the second member is integrated with the cover.

12. The control device according to claim 1, wherein
the hole portion includes a first hole segment and a second hole segment, the first hole segment penetrating both of the main surfaces of the second member, the second hole segment penetrating both of the main surfaces of the second member and communicating with the first hole segment, the second hole segment having a width larger than a width of the first hole segment in a direction of alignment of the pair of first members, and
contact of an edge of the first hole segment with the lower bottoms of the edges of the notch portions causes the second member to be supported by the pair of first members so as to be rotatable about the rotational axis.

13. The control device according to claim 12, wherein the second member includes a second metal plate having bent end portions, the end portions facing each other in a direction of alignment of the pair of first members.

14. The control device according to claim 12, wherein each of the pair of first members comprises a protrusion, the protrusion being disposed above and apart from the second member in a vertical direction while the opening is closed by the cover.

15. The control device according to claim 12, wherein the second member is integrated with the cover.

16. The control device according to claim 1, wherein the second member includes a second metal plate having bent end portions, the end portions facing each other in a direction of alignment of the pair of first members.

17. The control device according to claim 1, wherein each of the pair of first members comprises a protrusion, the protrusion being disposed above and apart from the second member in a vertical direction while the opening is closed by the cover.

18. The control device according to claim 1, wherein the second member is integrated with the cover.

19. The control device according to claim 1, further comprising a device for controlling the railway vehicle, the device being accommodated inside the housing.

* * * * *